United States Patent
Freund et al.

[19]

[11] Patent Number: 6,102,267
[45] Date of Patent: Aug. 15, 2000

[54] METHOD AND APPARATUS FOR NON-CONTACT PULSATING JET CLEAVING OF A SEMICONDUCTOR MATERIAL

[75] Inventors: Joseph Michael Freund, Fogelsville; William Andrew Gault, Mohnton; George John Przybylek, Douglasville; Dennis Mark Romero, Allentown; John William Stayt, Jr., Schnecksville, all of Pa.

[73] Assignee: Lucent Technologies, Inc., Murray Hill, N.J.

[21] Appl. No.: 09/208,768

[22] Filed: Dec. 10, 1998

[51] Int. Cl.[7] .................... H01L 21/301; H01L 21/46; H01L 21/78; H01L 21/00
[52] U.S. Cl. .................... 225/1; 225/93; 438/68; 438/460; 438/458; 438/464
[58] Field of Search .............................. 225/1, 2, 96, 93; 438/460, 458, 464, 68

[56] References Cited

U.S. PATENT DOCUMENTS

| | | | |
|---|---|---|---|
| 3,953,919 | 5/1976 | Moore | 438/464 |
| 4,195,758 | 4/1980 | Morgan . | |
| 4,859,269 | 8/1989 | Nishiguchi . | |
| 4,904,610 | 2/1990 | Shyr . | |
| 5,063,173 | 11/1991 | Gasser et al. . | |
| 5,154,333 | 10/1992 | Bauer et al. . | |
| 5,171,717 | 12/1992 | Broom et al. . | |
| 5,393,707 | 2/1995 | Canning | 438/460 |
| 5,418,190 | 5/1995 | Cholewa et al. | 438/464 |
| 5,719,077 | 2/1998 | Chakrabarti et al. . | |
| 5,904,548 | 5/1999 | Orcutt | 438/460 |
| 6,017,804 | 1/2000 | Freund et al. | 438/460 |

*Primary Examiner*—M. Rachuba
*Assistant Examiner*—Sean Pryor
*Attorney, Agent, or Firm*—Dickstein Shapiro Morin & Oshinsky LLP

[57] ABSTRACT

An apparatus and a method for non-contact cleaving a brittle, non-metallic solid material, such as semiconductor material, glass, quartz, ceramic or like material. A pulsating gas jet directs a jet of gas toward a support structure formed of a non-compliant material. The semiconductor material is positioned on the support structure between a pair of film layers. The semiconductor material is scored in at least one location on the material. A plastic buffer material is adhered to the support structure. The semiconductor material and the film layers are moved along the support structure until the score line is at a ledge of the support structure and underneath the source of gas. The jet of gas applies a sufficient force to cleave the semiconductor material as it passes off the ledge of the support structure, while minimizing vibration and/or turbulence. The buffer provides cushioning and inhibits the formation of fractures during the cleaving process.

8 Claims, 4 Drawing Sheets

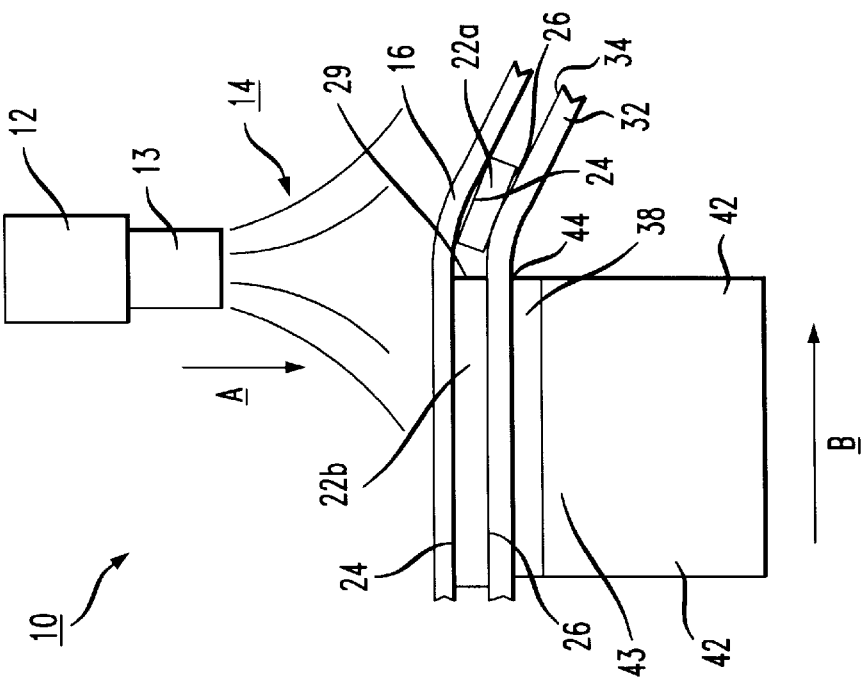
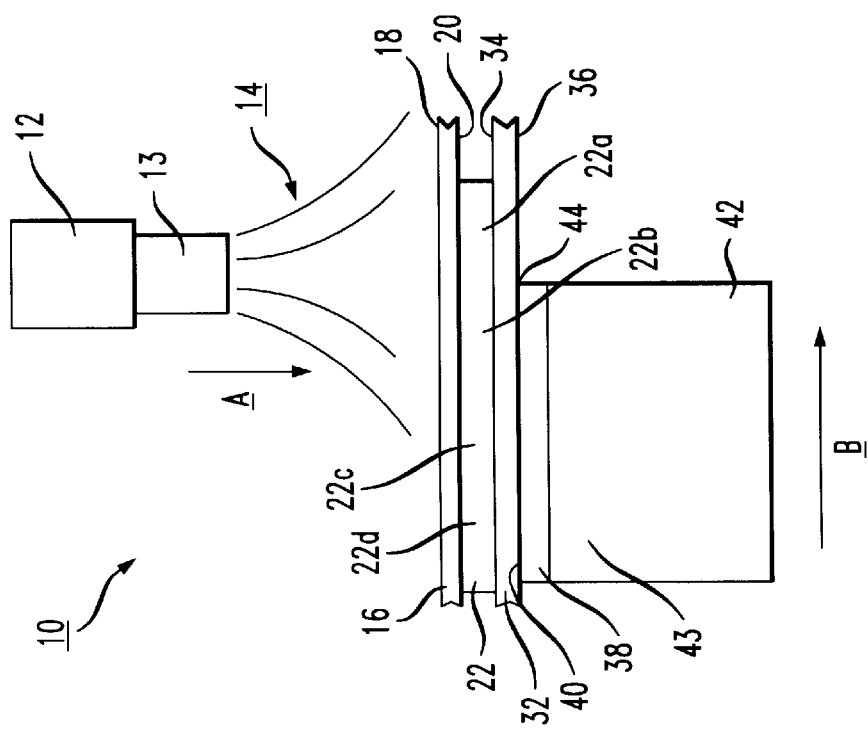

FIG. 5
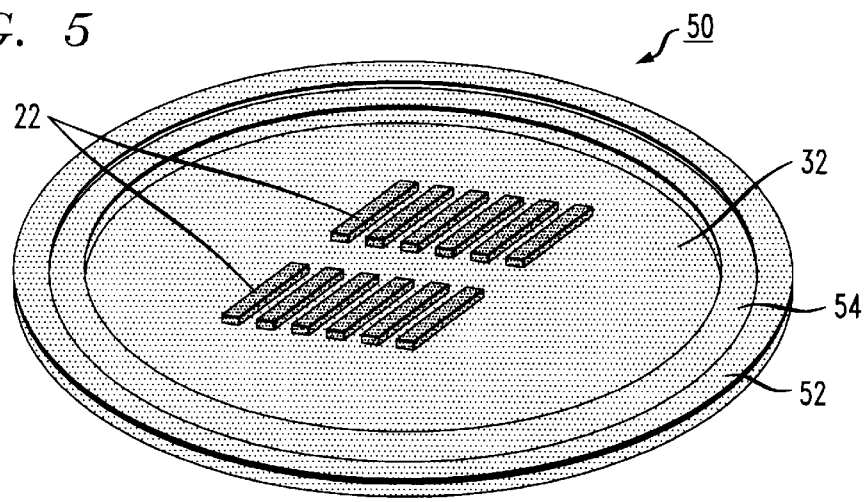
FIG. 6
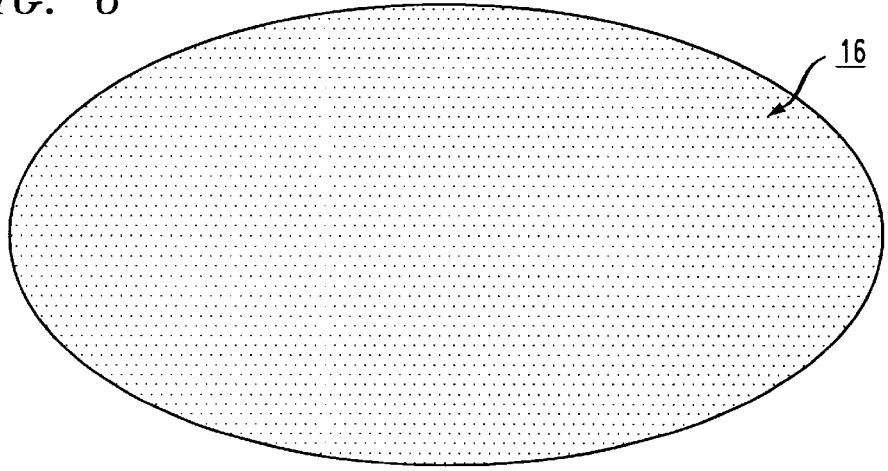
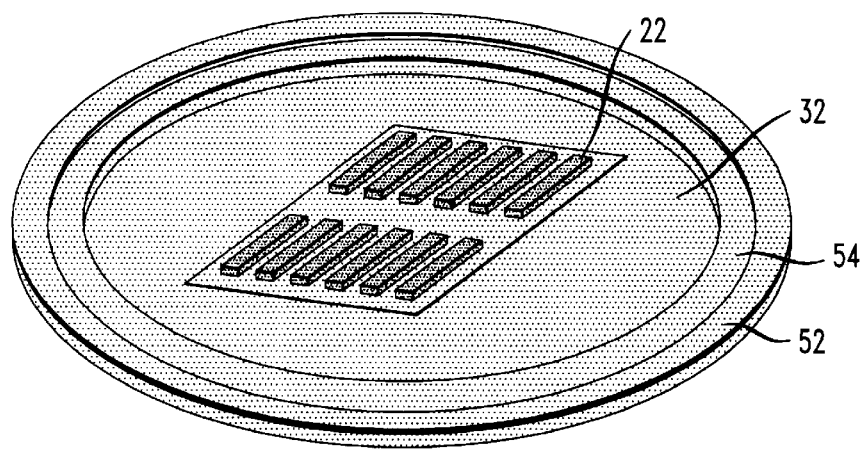

METHOD AND APPARATUS FOR NON-CONTACT PULSATING JET CLEAVING OF A SEMICONDUCTOR MATERIAL

FIELD OF THE INVENTION

The present invention relates generally to laser device fabrication, and more particularly, to an apparatus and method for cleaving a semiconductor material into constituent bars and/or into individual semiconductor devices.

BACKGROUND OF THE INVENTION

Semiconductor devices, such as lasers and photodetectors, generally are formed from a semiconductor wafer substrate. In the manufacture of such devices, the wafer substrate is separated, or cleaved, into bars of semiconductor material. These bars of semiconductor material may be further cleaved to form individual semiconductor devices.

Conventional methods for cleaving a wafer substrate generally include scribing or scoring the wafer substrate and then cleaving the substrate along the scoring line through some form of physical contact of an apparatus with the substrate. For example, U.S. Pat. No. 5,171,717 (Broom et al.) describes a method whereby a semiconductor wafer is scribed and then placed between two flexible transport bands. The transport bands are guided around a curved surface having a large radius. This surface applies a bending moment to the scribe lines, thereby cleaving the wafer.

U.S. Pat. No. 5,719,077 (Chakrabarti et al.) describes an apparatus which holds a semiconductor material between a fixed jaw and a rotatable jaw. The rotatable jaw rotates to cleave the semiconductor material. U.S. Pat. No. 5,154,333 (Bauer et al.) describes a device having a pair of pole shaped jaws of different lengths. One of the jaws has a weight on it to provide a downward force on the semiconductor bar being cleaved. As the semiconductor bar comes into contact with the two jaws, the uneven forces of the jaws causes a shearing force to cleave the semiconductor bar.

A problem incurred with cleaving semiconductor material by physically contacting the material is an uneven cleaved surface. If semiconductor material having an uneven cleaved surface is incorporated within an optical device, such as a laser, it may lead to insufficient light output or complete failure of the device.

As described in U.S. patent application Ser. No. 08/970,982, entitled "METHOD AND APPARATUS FOR CLEAVING SEMICONDUCTOR MATERIAL," the entire disclosure of which is incorporated herewith by reference, a continuous stream of gas may be used to alleviate the above discussed cleaving problems. However, certain problems leading to a less than optimal cleaving efficiency have been encountered under some conditions of operation with the use of a continuous stream of gas. Specifically, it has been determined that under certain conditions a continuous stream of gas creates a high incident pressure. The high pressure tends to cause the film layer carrying the semiconductor material to vibrate. The vibrations can dislodge the semiconductor material from this carrier film layer. Further, it has been noted that venting the continuous gas stream in such a way to minimize turbulence is difficult. The turbulence may alter the air pattern, resulting in the semiconductor material not receiving a substantially perpendicular force from the stream, thereby reducing cleaving efficiency.

SUMMARY OF THE INVENTION

The foregoing problems of the prior art are overcome to a great extent by the present invention, which relates to a method and apparatus which cleaves a semiconductor material without physically contacting the material. This cleaving apparatus provides a greater uniformity of the cleaved surface than from conventional cleaving devices and techniques, thus increasing the efficiency of the cleaving process and decreasing the number of semiconductor wafers which fail inspection due to an uneven cleaved surface.

In accordance with a preferred embodiment of the present invention, the apparatus for cleaving a semiconductor material includes a gas source, a pair of film layers, and a block having an upper portion with a ledge on which a buffer is positioned. One of the layers is positioned above the semiconductor material and the other layer is positioned below the semiconductor material to be cleaved. The layers are movable along the buffer, and the gas applies an intermittent force on the layers and the semiconductor material as they move along the buffer. The force cleaves the semiconductor material at a position adjacent to the ledge.

In an aspect of the present invention, the semiconductor material has at least one score on its side and the semiconductor material is cleaved along the score.

In another aspect of the present invention, means are provided for moving the pair of layers and the semiconductor material.

The foregoing and other advantages and features of the invention will be more readily understood from the following detailed description of the invention, which is provided in connection with the accompanying drawings.

BRIEF DESCRIPTION OF THE DRAWINGS

FIG. 1 is a side view of a non-contact cleaving apparatus constructed in accordance with a preferred embodiment of the present invention.

FIG. 2 is a side view of a non-contact cleaving apparatus showing a cleaved portion of a semiconductor material.

FIG. 5 is a perspective view of the hoop ring assembly of FIG. 4 with bars of semiconductor material.

FIG. 6 is an exploded view of the hoop ring assembly including the top film layer.

DETAILED DESCRIPTION OF PREFERRED EMBODIMENTS

Figure 3:
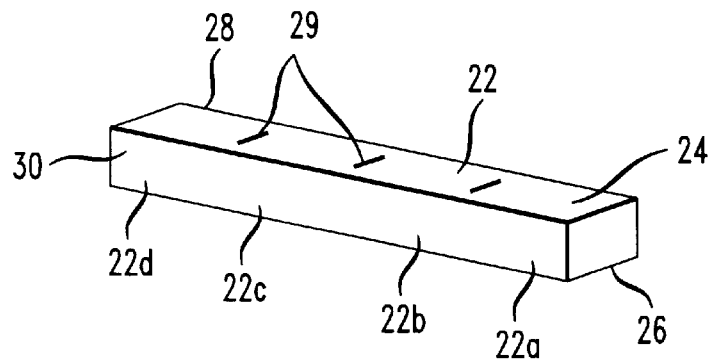
FIG. 3 is a perspective view of the semiconductor material of FIG. 1.
Figure 4:
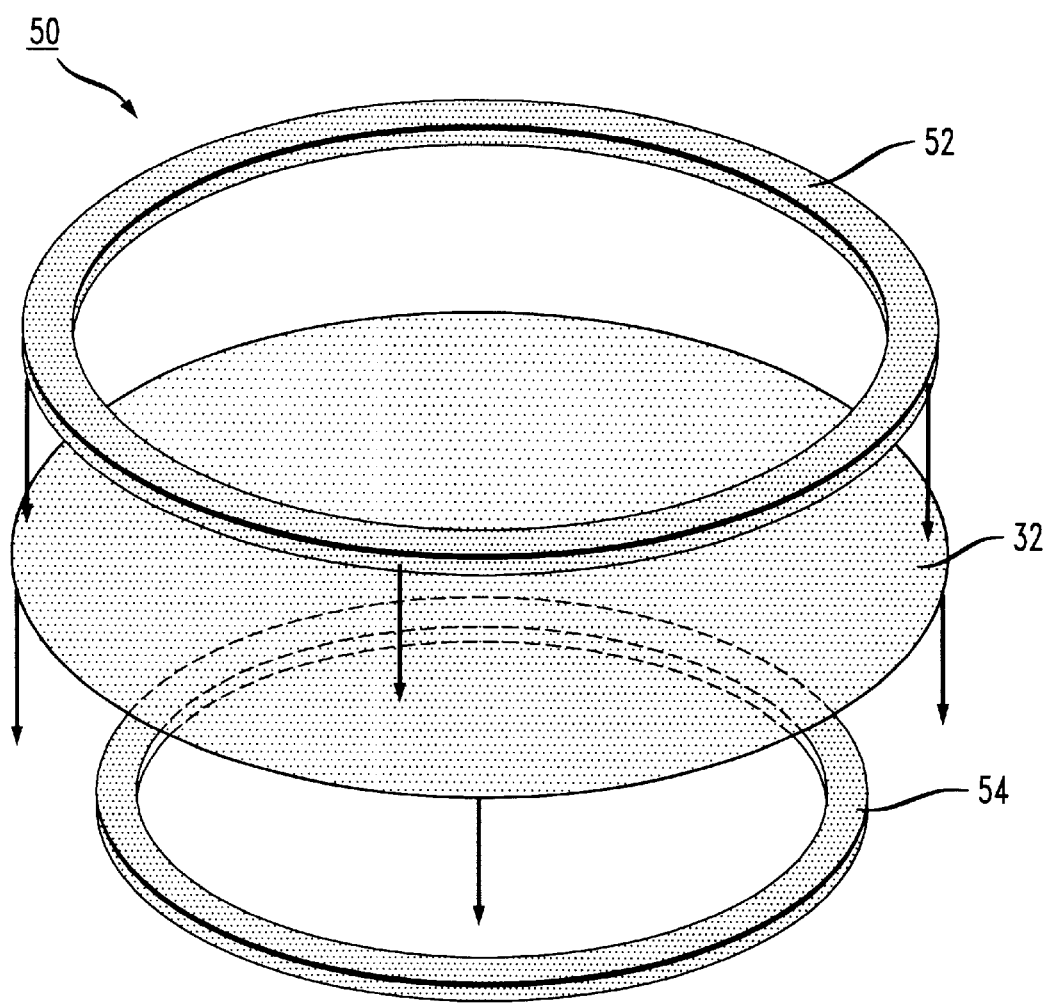
FIG. 4 is an exploded view of a hoop ring assembly utilized in cleaving the semiconductor material of FIG. 1.

Referring now to FIGS. 1–2, a non-contact cleaving apparatus 10 according to a preferred embodiment of the invention is shown. The cleaving apparatus 10 includes a gas source 12, a pair of film layers 16, 32, and a block, or support structure, 42 having a ledge 44. The gas source 12 provides a pulsating jet of gas toward the layers 16, 32 and toward a semiconductor material 22 (to be described in greater detail below). Specifically, the gas source 12 provides the gas by passing the gas through a nozzle 13. As illustrated, the gas source 12 provides a pulsating jet of gas 14 in the general direction A. The gas source 12 may include any gas which does not interact or otherwise have any adverse affect on the semiconductor material 22. Preferably, the gas source 12 provides a jet 14 of air. However, any other inert gas, such as nitrogen, argon, or carbon dioxide may be used.

The pressure of the gas may be as high as 120 psi entering the nozzle 13, but is more preferably in the range of between about 50 psi and 80 psi entering the nozzle 13. The pressure of the gas exiting the nozzle 13 is preferably in the range of between about 30 psi and 40 psi. Further, the frequency of the pulsating jet 14 may be as high as 60 Hertz. Other pressures and frequencies, both above and below the ranges detailed above, may nonetheless be utilized as long as the pressure is sufficient to induce cleaving of a semiconductor material 22 (described in detail below) and the frequency is insufficient to create vibrations which would dislodge the semiconductor material 22 from the film layers 16, 32.

The pulsating gas jet 14 may run continuously with pulses at a frequency of about 60 Hertz. Alternatively, a vision system or other suitable sensing apparatus may be used to sense when the pulsating gas jet 14 should be activated and deactivated. Instead, the gas jet 14 pulses may be mechanically indexed to the positioning of the semiconductor material 22, with activation and deactivation being accomplished by an operator viewing a monitor.

With reference to FIG. 3, the semiconductor material 22 is shown. The semiconductor material 22 has a top surface, or p-side, 24 and a bottom surface, or n-side, 26. Further, the semiconductor material 22 has a pair of sides 28, 30. The semiconductor material 22 is scored on the p-side 24 so as to create four semiconductor material segments 22a, 22b, 22c, and 22d. The scoring lines 29 create a weakness in the integrity of the semiconductor material 22. Each scoring line 29 may extend across the p-side 24 a distance in the range of about 120 microns to about 210 microns, depending upon the width of the semiconductor material 22. Although the semiconductor material 22 is shown to have four segments 22a, 22b, 22c, 22d, obviously any number of segments can be created in the semiconductor material 22 by adding any number of scoring lines 29.

While the material to be cleaved has been discussed as being the semiconductor material 22, other materials may be cleaved by the described apparatus and method. Specifically, other materials which may be cleaved include brittle, non-metallic solid materials. Brittle materials include those materials which fracture or cleave without appreciable prior plastic deformation. Included within the types of brittle, non-metallic solid materials are glass, quartz, ceramic and any other like materials. These brittle materials, as with the semiconductor material 22, would likely require a scoring line 29 be formed therein. Further, the pressure of the gas jet 14 may need to be increased in order to cleave these brittle materials.

Referring to FIGS. 1–2, the semiconductor material 22 is positioned between the top film layer 16 and the carrier film layer 32. The film layer 16 has an upper surface 18 and an undersurface 20. The undersurface 20 of the film layer 16 contacts with the p-side 24 of the semiconductor material 22. The film layer 32 has an upper surface 34 and an undersurface 36. The upper surface 34 of the film layer 32 comes in contact with the bottom surface (n-side) 26 of the semiconductor material 22. The film layers 16, 32 may be formed of, for example, polyvinyl chloride. The properties of the film layers 16, 32 are such that the semiconductor material 22 remains in place and does not move relative to the films layers 16, 32.

The undersurface 36 of the film layer 32 comes in contact with an upper portion 43 of the support structure 42. The support structure 42 is generally formed of a non-compliant material, such as steel. More specifically, a plastic buffer 38 is positioned on the upper portion 43 of the support structure 42. The undersurface 36 of the film layer 32 contacts with an upper surface 40 of the plastic buffer 38. The relative surface tensions of the film layer 32 and the plastic buffer 38 are such that the film layer 32 may freely slide along the surface of the plastic buffer 38. Preferably, the buffer 38 is adhered to the support structure 42 such that the buffer 38 extends across the entire upper portion 43 of the support structure 42 up to the ledge 44.

The buffer 38 provides a cushion at the ledge 44. Specifically, without the buffer 38, the support structure 42, which is made of a non-compliant material, often leads to the semiconductor material 22 separating improperly. In particular, the semiconductor material 22 may fracture instead of cleaving along the crystalline plane of the score line 29. The buffer 38 is formed of a material which distributes force uniformly under the carrier film layer 32. Specifically, the force of cleaving is spread uniformly along the scoring line 29.

Figure 7:
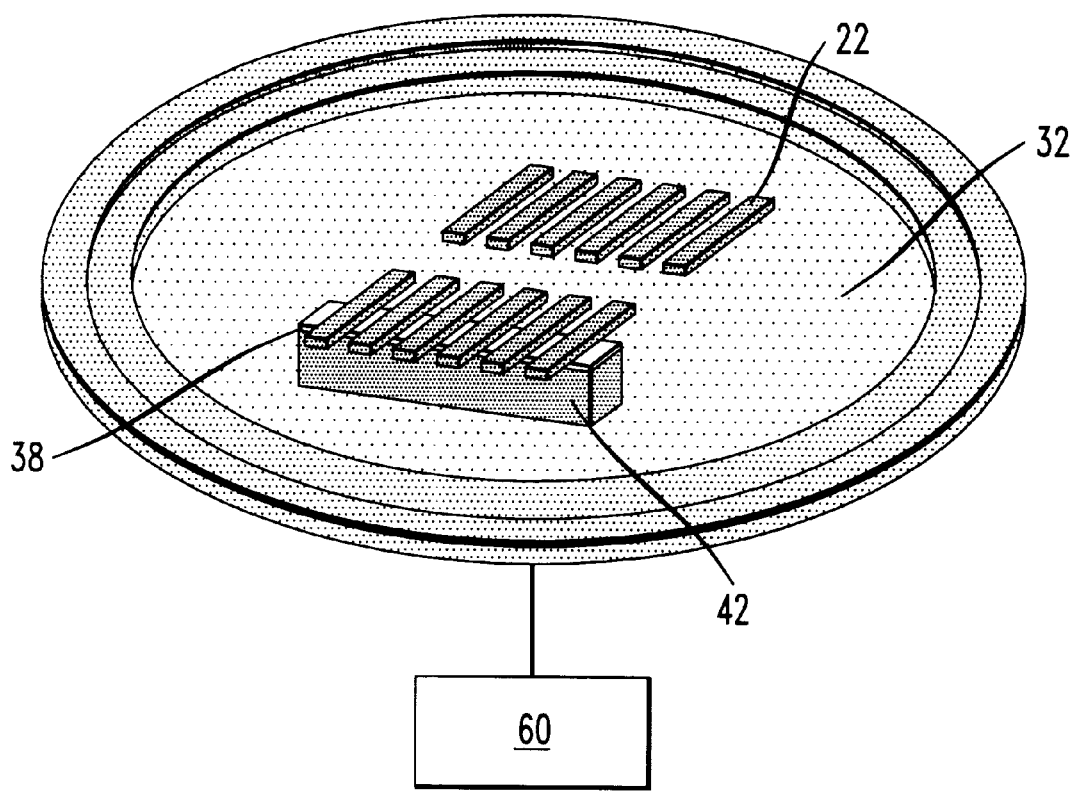
FIG. 7 is a perspective view of the hoop ring assembly including the support structure.

A moving apparatus is used to move the film layers 16, 32, and consequently the semiconductor material 22, in a direction B along the buffer upper surface 40. One example of a suitable moving apparatus, as shown in FIGS. 4–7, includes a hoop ring assembly 50 which engages and holds onto the film layer 32. The hoop ring assembly 50 rides on a stepper motor 60, as shown in FIG. 7. Other suitable moving apparatus may be used.

The hoop ring assembly 50 includes a pair of hoops 52, 54. The outer hoop 52 press fits over the carrier film layer 32 and the inner hoop 54. Then, a plurality of bars of semiconductor material 22 are arranged on the carrier film layer 32 (FIG. 5). The top film layer 16 is then overlain on the semiconductor material and the hoops 52, 54 (FIGS. 6, 7). Finally, the support structure 42 is positioned beneath the carrier film layer 32 and the entire assembly is positioned beneath the gas source 12.

As the semiconductor material 22 moves along the upper surface 40 of the plastic buffer 38, one scoring line 29 will move to the ledge 44 of the support structure 42. As illustrated, the gas source 12 is positioned generally above the ledge 44 so as to provide the jet 14 of gas 12 with the greatest amount of downward force directed toward the ledge 44. As shown in FIG. 2, as one scoring line 29 of the semiconductor material 22 comes underneath the gas source 12 adjacent to the ledge 44, the jet 14 of gas applies a pulsating downward force on the film layers 16, 32 and the semiconductor material 22 toward the scoring line 29. Because the scoring line 29 has created a weakness in the integrity of the semiconductor material 22, the segment 22a of the semiconductor material 22 is cleaved at the scoring line 29. Further movement of the semiconductor material 22 in the direction B will allow the semiconductor material 22 to be cleaved into the segments 22b, 22c, and 22d.

The buffer 38 provides a cushion at the cleaving point, i.e., at the ledge 44. At the same time, however, the buffer 38 does not prevent the film layers 16, 32 and the semiconductor material 22 from flexing at the cleaving point. The result is an improved separation, or cleaving, yield. Further, the quality of the cleave is improved in that less unevenness is experienced on the cleave surface along the scoring line 29.

The above description and drawings are only illustrative of certain preferred embodiments which achieve the objects, features and advantages of the present invention. The present invention is not to be considered as limited to these specific embodiments, but is only limited by the scope of the appended claims. For example, although the semiconductor material 22 is described as being scored on the p-side 24, which is positioned toward the gas stream 14, it is to be understood that the semiconductor material 22 may be scored on the n-side 26 and positioned n-side 26 up.

What is claimed as new and desired to be protected by Letters Patent of the United States is:

1. A method of cleaving a brittle, non-metallic solid material, comprising the steps of:

providing at least one score on the brittle, non-metallic solid material;

movably positioning the brittle, non-metallic solid material on a support structure, said support structure having an upper surface;

providing a gas jet at a first position from which the gas jet applies a force on the brittle, non-metallic solid material as it moves off said upper surface; and pulsating the gas jet at the first position to cleave the brittle, non-metallic solid material.

2. The method of claim 1, wherein said support structure includes a ledge, and wherein said gas jet directs said force toward the brittle, non-metallic solid material at a position adjacent said ledge.

3. The method of claim 2, wherein the brittle, non-metallic solid material includes semiconductor material.

4. The method of claim 3, further including the step of positioning one film layer above the semiconductor material and positioning a second film layer between the semiconductor material and said upper surface.

5. The method of claim 4, further including means for moving said pair of layers and the semiconductor material relative to said upper surface.

6. The method of claim 1, wherein a plurality of scores are provided on the brittle, non-metallic solid material, and wherein the brittle, non-metallic solid material is moved such that it is cleaved at each said score.

7. The method of claim 1, wherein said gas jet applies a downward force on the brittle, non-metallic solid material.

8. A method of cleaving a semiconductor material, comprising the steps of:

providing at least one score on the semiconductor material;

movably positioning the semiconductor material on a support structure, said support structure having an upper surface;

providing a gas jet at a first position from which the gas jet applies a force on the semiconductor material as it moves off said upper surface; and pulsating the gas jet at the first position to cleave the semiconductor material.

\* \* \* \* \*